United States Patent
Kataoka et al.

(10) Patent No.: US 6,273,791 B1
(45) Date of Patent: Aug. 14, 2001

(54) METHOD OF PRODUCING SEMICONDUCTOR WAFER

(75) Inventors: Makoto Kataoka; Yasuhisa Fujii; Kentaro Hirai; Hideki Fukumoto, all of Aichi (JP)

(73) Assignee: Mitsui Chemicals, Inc. (JP)

( * ) Notice: Subject to any disclaimer, the term of this patent is extended or adjusted under 35 U.S.C. 154(b) by 0 days.

(21) Appl. No.: 09/319,968

(22) PCT Filed: Nov. 17, 1998

(86) PCT No.: PCT/JP98/05161

§ 371 Date: Jun. 14, 1999

§ 102(e) Date: Jun. 14, 1999

(87) PCT Pub. No.: WO99/26282

PCT Pub. Date: May 27, 1999

(30) Foreign Application Priority Data

Nov. 18, 1997 (JP) .................................................. 9-317030

(51) Int. Cl.$^7$ ...................................................... B24B 1/00
(52) U.S. Cl. ................................................ 451/41; 451/288
(58) Field of Search ............................... 451/41, 63, 285, 451/286, 287, 288, 289, 397, 398

(56) References Cited

U.S. PATENT DOCUMENTS

| | | | |
|---|---|---|---|
| 4,138,304 | * | 2/1979 | Gantley ................................ 156/268 |
| 5,227,339 | * | 7/1993 | Kishii ................................... 437/225 |
| 5,268,065 | * | 12/1993 | Grupen-Shemansky ............. 156/630 |
| 5,281,473 | * | 1/1994 | Ishiwata et al. ..................... 428/345 |
| 5,310,442 | * | 5/1994 | Ametani .............................. 156/353 |
| 5,632,667 | * | 5/1997 | Earl et al. ............................. 451/41 |
| 5,851,664 | * | 12/1998 | Bennett et al. ................. 428/355 BL |
| 5,891,298 | * | 4/1999 | Kuroda et al. ...................... 156/344 |
| 6,039,830 | * | 3/2000 | Park et al. ............................ 156/267 |
| 6,048,749 | * | 4/2000 | Yamada ................................. 438/64 |
| 6,067,977 | * | 5/2000 | Wark et al. ............................ 125/35 |
| 6,159,827 | * | 12/2000 | Kataoka et al. ..................... 438/464 |
| 6,193,586 | * | 3/2001 | Park et al. ............................. 451/41 |

FOREIGN PATENT DOCUMENTS

| | | | |
|---|---|---|---|
| 0 530 729 A1 | * | 3/1993 | (EP) ............................ H01L/21/302 |
| 35 70 45 929A | * | 3/1982 | (JP) ............................ 148/DIG. 135 |
| 60189938 | | 9/1985 | (JP) . |
| 36 11 41 142A | * | 6/1986 | (JP) ..................................... 438/694 |
| 36 11 52 358A | * | 7/1986 | (JP) ..................................... 451/288 |
| 36 32 07 882A | * | 8/1988 | (JP) ..................................... 451/289 |
| 02028950 | | 1/1990 | (JP) . |
| 40 50 63 077A | * | 3/1993 | (JP) . |
| 40 50 82 492A | * | 4/1993 | (JP) ..................................... 438/694 |
| 7-201787 | | 8/1995 | (JP) . |
| 8-222535 | | 8/1996 | (JP) . |
| 08258038 | | 10/1996 | (JP) . |
| 8-302293 | | 11/1996 | (JP) . |

* cited by examiner

Primary Examiner—Derris H. Banks
Assistant Examiner—Hadi Shakeri
(74) Attorney, Agent, or Firm—Burns, Doane, Swecker, & Mathis, L.L.P.

(57) ABSTRACT

A method of producing a semiconductor wafer, which can prevent the breakage of a wafer, and also can reduce the working time in a series of operations attended by back surface grinding of the semiconductor wafer. The method involves producing a semiconductor wafer wherein an adhesive tape is applied on the surface of the semiconductor wafer and, after grinding the back surface of the semiconductor wafer using a grinding machine, the adhesive tape is peeled off, said process comprises using an adhesive tape having heat shrinkability as the adhesive tape, grinding the back surface of the semiconductor wafer and heating the adhesive tape in the grinding machine, thereby peeling off the adhesive tape from the surface of the semiconductor wafer.

12 Claims, No Drawings

METHOD OF PRODUCING SEMICONDUCTOR WAFER

TECHNICAL FILED

The present invention relates to a method of producing a semiconductor wafer. More particularly, it relates to a method of producing a semiconductor wafer, which comprises applying a semiconductor wafer surface protecting adhesive tape having heat shrinkability to the surface on which an integrated circuit of a semiconductor wafer such as silicon wafer is mounted (hereinafter referred to as the wafer surface), supplying the semiconductor wafer to a machine for grinding the back surface of the semiconductor wafer, grinding the surface on which the integrated circuit of the semiconductor wafer is not mounted (hereinafter referred to as the wafer back surface) and heating the adhesive tape in the grinding machine, thereby peeling off the adhesive tape from the wafer surface.

BACKGROUND ART

A semiconductor integrated circuit (hereinafter referred to as IC) is usually produced by slicing a high purity silicon single crystal to form a semiconductor wafer, mounting an integrated circuit on the surface using a means such as etching, shaving the back surface of the semiconductor wafer by grinding, etching, lapping or the like, thereby to reduce the thickness to about 200 to 400 $\mu$m, and dicing the wafer to form a chip. To sum up, after the completion of formation of IC, a chip is formed in a dicing step after going through four steps, that is, a step of applying an adhesive tape to the semiconductor wafer surface, a step of grinding the back surface of the semiconductor wafer, a step of peeling off the adhesive tape, and a step of washing the semiconductor wafer surface. When the semiconductor wafer is fed between these production steps, the semiconductor wafer is usually fed in the state of being encased in a cassette. That is, in the respective steps, a unit operation of taking out from the cassette and encasing it into the cassette is repeated. Such an operation can be not only the larger cause of breakage of a wafer because of the recent tendency of a reduction in thickness of the layer and an increase in diameter, but also the cause of complication of the steps and loss of the working time.

With the reduction in size of a semiconductor chip, a tendency of a reduction in thickness of a wafer is increased and a conventional thickness (about 200 to 400 $\mu$m) of a wafer after grinding the back surface was reduced to about 150 $\mu$m, depending on the kind of the chip. Also regarding the size, a conventional diameter (maximum 8 inch) tends to be increased to 12 inch, furthermore to 16 inch. Under the circumstance of the reduction in thickness and increase in diameter of the semiconductor wafer, the semiconductor wafer having the back surface subjected to grinding is liable to cause war page. In case that the adhesive tape is applied on the surface of the wafer, its tendency is increased by a tension of the adhesive tape. For the reason, the semiconductor wafer whose thickness is reduced after grinding contacts with an encasing port of the cassette in case of containing in the cassette and, therefore, the semiconductor wafer is liable to be broken only by applying a small impact.

In the grinding step of the back surface of the semiconductor wafer, a wafer surface protecting adhesive tape is applied on the wafer surface for the purpose of protecting IC formed on the surface of the semiconductor after and preventing the semiconductor wafer from breaking by a grinding stress. Since the adhesive tape becomes unnecessary after the completion of the grinding of the wafer back surface, it is peeled off from the wafer surface by using an adhesive tape peeling device. As a peeling method, for example, Japanese Patent Kokai Publication No. 28950/1990 discloses a method of applying a tape having a strong adhesive force referred to as a release tape on the base film surface of an adhesive tape applied on the semiconductor wafer surface and peeling the adhesive tape via the release tape. However, under the circumstance of the reduction in thickness and increase in diameter of the semiconductor wafer, the semiconductor is liable to be broken when the semiconductor wafer with severe warp is fixed to a chuck table of a peeling device or the adhesive tape is peeled off from the semiconductor wafer, as described above.

To prevent the breakage of the wafer when the adhesive tape is peeled off from the semiconductor wafer surface, there is suggested a film for surface protection wherein the peelability is improved. For example, Japanese Patent Kokai Publication No. 189938/1985 describes a method of applying an adhesive film comprising a light transmitting substrate and a pressure-sensitive adhesive having a property capable of curing by light irradiation to form a three-dimensional network, said pressure-sensitive adhesive being provided on said substrate, on the wafer surface in case of grinding the back surface of the semiconductor wafer, irradiating this adhesive film with light after grinding, and peeling off the adhesive film without causing the breakage of the wafer. However, the pressure-sensitive adhesive (adhesive layer) having a property capable of curing by light irradiation to form a three-dimensional network, which is disclosed in the invention, is an adhesive layer capable of polymerizing by the radical polymerization. Therefore, when oxygen is entrapped between the wafer and adhesive layer, the curing reaction does not proceed sufficiently by the polymerization inhibition effect of oxygen and the wafer surface is sometimes contaminated with the uncured adhesive having a low cohesive force at the time of peeling after grinding the wafer back surface. Since the wafer surface on which an integrated circuit is mounted has a complicated irregularity, it is very difficult to apply the adhesive film without entrapping any air (oxygen). To make a system wherein oxygen is removed for applying, it is necessary to newly dispose a device. Contamination caused by such an adhesive can be removed by washing with a solvent, sometimes, but can not completely be removed at present in almost all of cases. According to this method, any advantage cannot be found with respect to the prevention of the breakage of the wafer and reduction of the working time when the wafer is fed to the adhesive tape peeling step after grinding the wafer back surface.

As described above there has been required a method of producing a semiconductor wafer, which can maintain the contamination resistance of the wafer surface and prevention of the breakage of the wafer back surface at the time of grinding at the same level as that of the prior art under the circumstance of the increase in bore diameter and reduction in thickness of the semiconductor wafer, and does not cause the breakage of the wafer when the adhesive tape is peeled off and the wafer is fed between the respective processing steps, and also which can reduce the working time.

DISCLOSURE OF THE INVENTION

It is an object of the present invention to solve the above problems and to provide a method of producing a semiconductor wafer, which can prevent the breakage of the wafer when the semiconductor wafer is fed and the adhesive tape for semiconductor wafer surface protection is peeled off, and which can reduce the working time.

To accomplish the above object, the present inventors have intensively studied. As a result, they have found that an adhesive tape can be easily peeled off without causing the breakage of a semiconductor wafer by applying an adhesive tape for semiconductor wafer surface protection having heat shrinkability on the wafer surface, grinding the back surface in a semiconductor wafer back surface grinding machine and heating the adhesive tape in the same grinding machine, thereby making it possible to omit an adhesive tape peeling step as a conventional subsequent step. Thus, the present invention has been completed.

That is, the present invention provides a method of producing a semiconductor wafer wherein an adhesive tape is applied on the surface of the semiconductor wafer and, after grinding the back surface of the semiconductor wafer using a grinding machine, the adhesive tape is peeled off, said process comprises using an adhesive tape having heat shrinkability as the adhesive tape, grinding the back surface of the semiconductor wafer and heating the adhesive tape in the grinding machine, thereby peeling off the adhesive tape from the surface of the semiconductor wafer in the grinding machine.

In the present invention, a preferable method of heating the adhesive tape in the grinding machine includes, for example, a method using at least one heating medium selected from the group consisting of warm water and warm air. The temperature of the heating medium is within a range from 50 to 99° C., and preferably from 50 to 80° C. Furthermore, the wafer surface may also be washed with a washing solution after the adhesive tape was peeled off in the grinding machine. In this case, water, warm water or the like is preferably used as the washing solution.

According to the method of the present invention, even if the back surface of the semiconductor wafer having a diameter of 6 to 16 inch, preferably 6 to 12 inch, is ground, thereby to reduce the thickness to about 80 to 400 μm, preferably 80 to 200 μm, the semiconductor wafer is not broken when the adhesive tape is peeled off after grinding the back surface. Since the method is a method of peeling off the adhesive tape by utilizing heat shrinkability of the adhesive tape itself in the grinding machine after grinding the back surface, the adhesive tape is not applied on the surface of the wafer in case that the wafer is taken out from the grinding machine and encased in the cassette, resulting in little warp. Accordingly, the wafer is not broken by contacting with the encased port of the cassette in case of being encased in the cassette. Furthermore, feed to the washing step as the subsequent step can be omitted if the wafer surface is washed in the grinding machine.

According to the present invention, the semiconductor wafer is not broken in case of peeling off the adhesive tape even in case that the back surface of the semiconductor wafer having a diameter of 6 to 16 inch is ground, thereby to reduce the thickness to about 80 to 200 μm. Since the present invention involves a method of peeling the adhesive tape by utilizing heat shrinkability in the grinding machine, the wafer undergoes little warp when the wafer is taken out from the grinding machine and encased in the cassette. Accordingly, the wafer is not broken by contacting with the encasing port of the cassette in case of encase in the cassette. Furthermore, a washing step, which has conventionally been performed as the subsequent step, can be omitted if the adhesive tape is heated and peeled off in the grinding machine by using warm water as the heating medium of the adhesive tape and, furthermore, the wafer is washed with a washing solution. Therefore, according to the present invention, a series of steps from grinding of the back surface of the semiconductor wafer to washing of the wafer surface can be carried out in a short time, thereby making it possible to reduce the working time.

BEST MODE FOR CARRYING OUT THE INVENTION

The present invention will be described in detail hereinafter. The summary of the present invention is as follows. That is, a release film is peeled off from an adhesive layer of an adhesive tape for surface protection of a semiconductor wafer (hereinafter referred to as an adhesive tape), thereby exposing the adhesive layer surface, and then the adhesive tape is applied on the surface, on which an integrated circuit of the semiconductor wafer is mounted, via the adhesive layer. Then, the semiconductor wafer is fixed to a chuck table of a grinding machine via a base film layer of the adhesive tape and the back surface of the semiconductor wafer is ground. After the completion of grinding, the adhesive tape is subsequently heated in the grinding machine, thereby peeling off the adhesive tape. Then, the wafer surface is optionally washed, taken out from the grinding machine and contained in a cassette. The cassette is fed to the subsequent step such as dicing step.

The adhesive tape used in the present invention is an adhesive tape wherein an adhesive layer is formed on one surface of a base film having heat shrinkability. To protect the adhesive layer during the storage and feed, a release film usually referred to as a separator is preferably applied on the surface of the adhesive layer.

Regarding the method of producing the adhesive tape, an adhesive is first applied on one surface of a release film and dried to form an adhesive layer, and then the adhesive layer is transferred to the surface of a base film having heat shrinkability. As the base film having heat shrinkability, preferred are those wherein a shrinkage factor at 50 to 99° C., preferably 50 to 80° C., in a monoaxial or biaxial (longitudinal, transverse) direction is within a range from 5 to 50%.

The release film may be essentially any film having a surface tension lower than that of the base film even if the absolute value of a surface tension is any value. The heat resistance of the release film exerts an influence on dryness of the adhesive applied on the surface. When the heat resistance is poor, it is necessary to adjust the drying temperature of the adhesive to a low temperature. Therefore, it takes a long time to dry the adhesive and the adhesive can not be efficiently dried in a short time. For example, the release film causes heat shrinkage in a drying oven and defects such as wrinkle occur in the release film and, therefore, an adhesive layer having a uniform thickness can not be formed, sometimes. From such a point of view, the release film preferably has the predetermined heat resistance. As the evaluation criteria of the heat resistance, it preferably has a Vicat softening point of not less than 100° C. As far as the above conditions are satisfied, the release film is not specifically limited. The release film may be a single-layer film or a multi-layer film, and can be appropriately selected from commercially available products.

Specific examples of the release film include films produced from high-density polyethylene, polypropylene, polyethylene terephthalate, polyamide resin, or a mixture thereof. Preferred examples thereof include high-density polyethylene film, polypropylene film and polyethylene terephthalate film. The method of producing these films is not specifically limited, and these films may be those produced by publicly known methods such as extrusion method, calendering method and the like. The molding temperature may be a temperature which is not less than a glass transition point or a softening point of the raw resin and is lower than a decomposition temperature.

For the purpose of reducing a peeling stress when the release film is peeled from the adhesive layer, a releasant such as silicone compound may be applied on the surface of the release film, on which the adhesive is applied, as far as the adhesive layer is not contaminated. The thickness of the release film varies depending on the drying conditions, kind and thickness of the adhesive layer, or processing conditions and processing method of the adhesive tape, but is usually from 10 to 1000 $\mu$m, and preferably from 20 to 100 $\mu$m.

The heat shrinkability of the adhesive tape exerts an influence on the peelability of the adhesive tape from the semiconductor wafer surface. When the shrinkage factor is too low, poor peel occurs at the time of heating and it takes a long time to peel the adhesive tape. On the other hand, when the shrinkage factor is too high, the adhesive tapes is deformed with a lapse of time during the storage and, therefore, the workability in case of applying the adhesive tape on the wafer surface is lowered. From such a point of view, the heat shrinkage factor at 50 to 99° C., preferably 50 to 80° C., is preferably from 5 to 50%. In this case, the adhesive tape may be a tape which exhibits the above heat shrinkability in at least one point within the above temperature range. The shrinkage direction may be a monoaxial direction or a biaxial (longitudinal, transverse) direction. The material is not specifically limited. Specific examples thereof include ethylene-vinyl acetate copolymer, ethylene-methacrylic acid copolymer, polybutadiene copolymer, polybutadiene, soft vinyl chloride resin, resins such as polyolefin, polyester, polyamide and ionomer, and copolymer elastomer thereof, and diene, nitrile and acrylic films. The base film may be an single-layer material or a multi-layer material.

Taking the prevention of the breakage of the semiconductor wafer during the grinding of the wafer back surface into consideration, a film having elasticity obtained by forming a resin having a Shore D-scale hardness of 40 or less defined in ASTM-D-2240 into a film, for example, ethylene-vinyl acetate copolymer (hereinafter referred to as EVA) film and polybutadiene film may be preferably used. In this case, it is preferred to laminate a film having both a hardness higher than that of the base film, and a heat shrinkablity on the surface opposite the surface on which the adhesive layer of the base film is provided, for example, a film obtained by forming a resin having a Shore D-scale hardness of higher than 40 into a film. Consequently, the rigidity of the adhesive tape is increased, thereby improving the applying workability.

The thickness of the base film is appropriately decided according to the shape, surface condition, grinding method and grinding conditions of the semiconductor wafer to be protected, and cutting and applying workability of the adhesive tape for wafer surface protection. Usually, thickness of the base film is from 10 to 1000 $\mu$m, preferably from 100 to 300 $\mu$m.

The method of producing the base film is not specifically limited, and the base film may be any one produced by publicly known methods such as extrusion method and calendering method. The molding temperature may be a temperature which is not less than a glass transition point or a softening point of the raw resin and is lower than a decomposition temperature. To impart the heat shrinkability to the base film, stretching is preferably performed at least in a monoaxial direction. The stretching ratio exerts an influence on the peelability and workability in case that the adhesive tape is peeled off from the wafer surface after grinding the wafer back surface. When the stretching ratio is low, sufficient shrinkage of the base film does not occur by heating in case of peeling from the wafer surface, resulting in deterioration of the peelability and workability. Taking such a point into consideration, the stretching ratio is not less than 1.2, and preferably not less than 1.5. The stretching of the base film may be a monoaxial stretching wherein stretching is performed in a longitudinal or transverse direction of the film, or a biaxial stretching wherein stretching is performed in a longitudinal and transverse direction of the film. The upper limit of the stretching ratio is about 10 taking the breakage at the time of stretching into consideration.

Also the stretching method is not specifically limited, and may be publicly known methods such as longitudinal monoaxial stretching method using a roll rolling method and roll stretching method, longitudinal/transverse successive biaxial stretching method using a tenter, and longitudinal/transverse simultaneous biaxial stretching method using a tenter. The stretching temperature is preferably from 40 to 70° C. The base film stretched as described above is heat-treated so as not to cause shrinkage with a lapse of time. The heat treating temperature is preferably from 45 to 80° C.

It is necessary that a surface tension of the surface of the base film, on which at least an adhesive layer is to be applied, is higher than that of the release film. The base film may be any film having a surface tension higher than that of the release film even if the absolute value of a surface tension is any value. Taking the adhesion of the adhesive layer to base film after transferring from the release film into consideration, the base film may be preferably selected according to such criteria that the film is a stretched film having a surface tension of not less than 35 dyne/cm. When the surface tension is low, the adhesion between the adhesive layer and the base film is lowered and transfer of the adhesive layer from the release film can not be performed, satisfactorily. The method of increasing the surface tension of the base film includes, for example, corona discharge treatment.

The composition of the adhesive is not specifically limited, and can be appropriately selected from commercially available products. In view of the adhesion, applicability and contamination resistance of the wafer surface, an acrylic adhesive is preferred. Such an acrylic adhesive can be obtained by copolymerizing a monomer mixture containing an alkyl acrylate monomer and a monomer having a carboxyl group. If necessary, it is possible to copolymerize with a vinyl monomer, a polyfunctional monomer and an internal crosslinking monomer, which are copolymerizable with them.

The alkyl acrylate monomer includes, for example, methyl acrylate, methyl methacrylate, ethyl acrylate, ethyl methacrylate, propyl acrylate, propyl methacrylate, butyl acrylate, butyl methacrylate, hexyl acrylate, hexyl methacrylate, octyl acrylate, octyl methacrylate, nonyl acrylate, nonyl methacrylate, dodecyl acrylate and dodecyl methacrylate. A side chain alkyl group of these monomers may be in a straight-chain or branched form. Two or more alkyl acrylate monomers may be used in combination.

The monomer having a carboxyl group includes, for example, acrylic acid, methacrylic acid, crotonic acid, itaconic acid, maleic acid and fumaric acid. The vinyl monomer copolymerizable with the alkyl acrylate monomer and the monomer having a carboxyl group includes, for example, hydroxyethyl acrylate, hydroxyethyl methacrylate, hydroxypropyl acrylate, hydroxypropyl methacrylate, acrylamide, methacrylamide, dimethylamino acrylate, dimethylamino methacrylate, vinyl acetate, styrene and acrylonitrile.

The polymerization reaction mechanism of the adhesive polymer includes, for example, radical polymerization, anionic polymerization and cationic polymerization. Taking the production cost of the adhesive, influence of a functional group of the monomer, and influence of an ion on the semiconductor wafer surface into consideration, the adhesive polymer is preferably polymerized by the radical polymerization. A radical polymerization initiator used in case of polymerizing by the radical polymerization includes, for example, organic peroxides such as benzoyl peroxide, acetyl peroxide, isobutyryl peroxide, octanoyl peroxide, ditertial butyl peroxide and ditertial peroxide; inorganic peroxides such as ammonium persulfate, potassium persulfate and sodium persulfate; and azo compounds such as 2,2'-azobisisobutyronitrile, 2,2'-azobis-2-methylbutyronitrile and 4,4'-azobis-4-cyanovaleric acid.

In case of polymerizing by the emulsion polymerization, inorganic peroxides such as water-soluble ammonium persulfate, potassium persulfate and sodium persulfate; and azo compounds having a carboxyl group in the molecule, such as water-soluble 4,4'-azobis-4-cyanovaleric acid are preferred among these radical polymerization initiators. Taking an influence of an ion on the semiconductor wafer surface into consideration, an azo compound having a carboxyl group in the molecule, such as water-soluble 4,4'-azobis-4-cyanovaleric acid is more preferred.

A crosslinking agent having two or more crosslinking functional groups in one molecule used in the present invention is used to adjust an adhesive force and a cohesive force by reacting with a functional group of the adhesive polymer. The crosslinking agent includes, for example, epoxy compounds such as sorbitol polyglycidyl ether, polyglycerol polyglycidyl ether, pentaerythritol polyglycidyl ether, diglycerol polyglycidyl ether, glycerol polyglycidyl ether, neopentyl glycol diglycidyl ether and resorcin diglycidyl ether; isocyanate compounds such as tetramethylene diisocyanate, hexamethylene diisocyanate, toluene diisocyanate triadduct of trimethylolpropane and polyisocyanate; aziridine compounds such as trimethylolpropane-tri-β-aziridinyl propionate, tetramethylolmethane-tri-β-aziridinyl propionate, N,N'-diphenylmethane-4,4'-bis(1-aziridinecarboxyamide), N,N'-hexamethylene-1,6-bis(1-aziridinecarboxyamide), N,N'-toluene-2,4-bis(1-aziridinecarboxyamide) and trimethylolpropane-tri-β-(2-methylaziridine propionate; and melamine compounds such as hexamethoxymethylolmelamine.

These compounds may be used alone, or two or more kinds of them may be used in combination. In case of using the epoxy crosslinking agent among the above crosslinking agents, the rate of the crosslinking reaction is low. In case that the reaction does not proceed sufficiently, the cohesive force of the adhesive layer is lowered and contamination caused by the adhesive layer occurs depending on the irregularity of the semiconductor wafer surface. Accordingly, it is preferred to appropriately add a catalyst such as amine or to copolymerize a monomer containing an amine functional group having an catalytic action with the adhesive monomer, or to use an aziridine crosslinking agent having a property as amine in combination in case of using the crosslinking agent.

The amount of the crosslinking agent is usually added within a range where the number of functional groups in the crosslinking agent is not larger than that in the adhesive polymer. However, when a functional group is newly formed by the crosslinking reaction and the crosslinking reaction proceeds slowly, excess crosslinking agent may be added, if necessary. The adhesive force of the adhesive tape for grinding the wafer back surface is usually from about 10 to 1000 g/25 mm, and preferably from about 30 to 600 g/25 mm, in terms of an adhesive force to a SUS-BA plate. The adhesive force is adjusted within the above range according to the grinding conditions of the wafer back surface, bore diameter of the wafer, and thickness of the wafer after grinding. Specifically, the crosslinking agent is added in the amount within a range from 0.1 to 30 parts by weight, and preferably from 0.3 to 15 parts by weight, based on 100 parts by weight of the adhesive polymer.

It is also possible to optionally add a surfactant to the adhesive as far as the wafer surface is not contaminated. The surfactant to be added may be nonionic or anionic as far as the wafer surface is not contaminated. Examples of the nonionic surfactant a include polyoxyethylene octyl phenyl ether, polyoxyethylene nonyl phenyl ether and polyoxyethylene lauryl ether. Examples of the anionic surfactant include alkyl diphenyl ether disulfonate and its salt, bis-naphthalene sulfonate and its salt, polyoxyalkyl sulfosuccinate and its salt, and sulfate of polyoxyethylene phenyl ether and its salt.

The above surfactants may be used alone, or two or more kinds of them may be used in combination. The amount of the surfactant is preferably from 0.05 to 5 parts by weight, and more preferably from 0.05 to 3 parts by weight, based on the total weight of the adhesive polymer and crosslinking agent, that is, 100 parts by weight of the crosslinked adhesive polymer.

As a method of coating an adhesive coating emulsion or solution on one surface of the base film or release film, there can be used a conventionally known coating method, for example, roll coating method, gravure coating method and bar coating method. The drying conditions of the applied adhesive are not specifically limited. In general, it is preferred to dry at a temperature ranging from 80 to 200° C. for 10 seconds to 10 minutes. More preferably, drying is performed at a temperature ranging from 80 to 170° C. for 15 seconds to 5 minutes. The thickness of the adhesive layer is appropriately decided according to the surface condition, shape and grinding method of the back surface of the semiconductor wafer, but is usually from about 2 to 100 μm, and preferably from 5 to 70 μm, taking the adhesive force in case of grinding the back surface of the semiconductor wafer and the peelability after the completion of the grinding into consideration.

After the adhesive layer is formed on the surface of the release film as described above, the base film is put on the surface of the adhesive layer and the adhesive layer is transferred to the surface of the base film by pressing. The transferring method may be a conventionally known method. For example, there can be used a method of putting the surface of the base film to the surface of the adhesive layer formed on the surface of the release film, and pressing them by passing through a nip roll. The release film is preferably peeled off from the surface of the adhesive layer immediately before using as the adhesive tape. The adhesive tape thus obtained is formed into a roll or cut into a predetermined shape, and then stored or fed.

The method of producing the semiconductor wafer, comprising a series of steps from the step of adhering the adhesive tape on the surface of the semiconductor wafer to the dicing step will be described in detail hereinafter.

In the present invention, the adhesive tape is applied on the semiconductor wafer surface via the adhesive layer. The operation of applying the adhesive film on the semiconductor wafer surface is sometimes performed by human hands, but is usually performed by using a device referred to as an automatic applying device equipped with an adhesive film in the form of a roll. Such an automatic applying device includes, for example, Model ATM-1000B and ATM-1100 (manufactured by Takatori Corp.) and Model STL series (manufactured by Teikoku Seiki Co., Ltd.).

The semiconductor wafer is fixed to the chuck table of the wafer back surface grinding machine via the base film layer of the adhesive tape. The semiconductor wafer is ground by using the grinding machine until the thickness of the wafer back surface is reduced to a predetermined thickness. During the grinding, cooling water is generally poured on the grinding surface. As a back surface grinding system, a publicly known grinding system such as through-feed system and infeed system is employed. The thickness of the semiconductor is from 500 to 1000 $\mu$m before grinding, whereas, the thickness is from about 80 to 400 $\mu$m, and preferably from about 80 to 200 $\mu$m after grinding. The thickness of the semiconductor wafer before grinding is appropriately decided by the bore diameter and kind of the wafer, whereas, the thickness of the semiconductor wafer after grinding is appropriately decided by the size of the resulting chip and the kind of IC.

After the completion of the grinding, shavings were removed by a method of pouring pure water on the grinding surface. Then, the wafer was turned over and fixed to the chuck table via the wafer back surface. The adhesive tape is then heated to cause shrinkage of the base film layer, thereby peeling off the adhesive tape from the wafer surface. The peeled adhesive tape is removed out of the system by a method of sucking using an exclusive jig.

The state where the adhesive tape is peeled off refers to the state where the adhesive tape applied on the wafer surface is peeled off over not less than 20% of the wafer surface. In this case, the other portion of the heated adhesive tape is deformed by heat shrinkage and is in the state of being easily peeled off. Although the detailed peeling mechanism is not clear, in case of peeling with heating using warm water, warm water penetrates almost all of the interface between the wafer surface and adhesive layer even in the non-peeled portion. Also in case of peeling by using a warm air, partial lifting attended by a deformation stress of the base film occurs at the interface between the wafer surface and adhesive layer.

The heating method is not specifically limited as far as the adhesive tape applied on the wafer surface can cause heat shrinkage, and includes, for example, a method of pouring warm water at 50 to 99° C., preferably 50 to 80° C., on the adhesive tape, a method of contacting the adhesive tape with water at 50 to 99° C., preferably 50 to 80° C., by using a method of immersing in warm water at 50 to 99° C., preferably 50 to 80° C., together with the wafer, and a method of blowing a warm air at 50 to 99° C., preferably 50 to 80° C. Taking the heat conductivity to the adhesive tape for causing shrinkage of the base film into consideration, a method of contacting warm water at 50 to 99° C., preferably 50 to 80° C., with the adhesive tape is preferred. Furthermore, considering the fact that the wafer surface is washed in the same grinding machine after peeling off the adhesive tape, a method of heating by pouring warm water at the above temperature on the adhesive tape surface is preferred. In this case, considering the fact that the peelability is more improved by uniformly pouring warm water on the base film surface of the adhesive tape, a method of pouring warm water with rotating the wafer at a rotational speed of 5 to 500 rpm is preferred. Regarding the rotating method of the wafer, the wafer may be rotated on the center of the wafer as a rotation center point.

In the present invention, after peeling the adhesive tape the wafer surface can be washed by pouring a washing liquid such as pure water or, alcohols thereon. Pure water is preferably used as the washing liquid. By using these methods, an exclusive washing step to be carried out after the wafer back surface grinding step can be usually omitted and a series of steps from the wafer back surface grinding step to the surface washing step can be simplified, thereby making it possible to reduce the working time.

The heating temperature can be appropriately selected within a range from 50 to 99° C., and preferably from 50 to 80° C., according to the stretching ratio of the base film, adhesive force of the tape for semiconductor wafer surface protection, and the kind of the heating method. The heating time also exerts an influence on the peelability from the semiconductor wafer surface. The heating time varies depending on the stretching ratio and heating temperature of the base film. Usually, the heating time is from 1 to 60 seconds, and preferably from 10 to 30 seconds, taking the workability into consideration.

Conventionally, there has been employed a method of encasing a wafer in a cassette after the completion of the grinding of the wafer back surface, feeding the cassette to an adhesive tape peeling step, setting the cassette in a peeling device, taking out the wafer from the cassette, and peeling the adhesive tape. There has also been employed a method that peeling off the adhesive tape, then encasing again in the cassette, feeding the cassette to a washing step, taking out the wafer from the cassette, setting the wafer in a washing device, and washing the wafer surface. In case of feeding to the washing step, the wafer is encased into or taken out from the cassette in the state where the adhesive tape is applied on the wafer surface. Therefore, when the wafer is largely ground until the thickness of the wafer is reduced to 200 $\mu$m or less, the wafer experiences severe warp and is often broken by an impact produced by contacting the wafer with the encasing port of the cassette. In case that the bore diameter is large such as 12 inch or more, severe warp occurs even if the thickness after grinding is about 400 $\mu$m.

On the other hand, according to the method of the present invention, the adhesive tape is peeled off by heating in the back surface grinding machine and, at the same time, the washing treatment of the wafer surface is carried out. Therefore, it is unnecessary that the wafer whose thickness was reduced by grinding the back surface is encased in the cassette and then fed to the peeling step, furthermore to the washing step. Therefore, the time of working of encasing into the cassette for wafer feeding and the time of working of taking out from the cassette are very small. Particularly, since feed from the back surface grinding step to the peeling step can be omitted, the breakage of the wafer caused by warp of the wafer at the time of encasing in or taking out from the cassette can be prevented. Moreover, the wafer surface washing step can also be omitted by washing the wafer surface with a washing solution such as pure water or, alcohols in the grinding machine after the completion of the back surface grinding, heating of the adhesive tape and peeling. Finally, a series of steps are completed by drying the wafer using a method of rotating at a high speed such as about 1000 to 10000 rpm. The size of the semiconductor wafer, to which the present invention can be applied, is from 6 to 16 inch, and preferably from 6 to 12 inch, in terms of a diameter.

EXAMPLES

The following Examples further illustrate the present invention in detail but are not to be construed to limit the scope thereof. Various characteristic values shown in the Examples were measured by the following procedure.

(1) Shrinkage Factor (%) of Adhesive Tape

Fifteen test pieces having a square shape of 10 cm in side are made by selecting each optional position of an adhesive tape. After peeling off a release film from the test piece, the test piece is heated in an air oven at 25, 50 and 80° C. for 1 minute and then allowed to stand at room temperature for 5 minutes. The length in the longitudinal direction (machine direction) of the test a piece is measured, and then the shrinkage factor $\{(L_1-L_2)/L_1\} \times 100$ (%) is determined from the length before heating ($L_1$) and the length after heating ($L_2$). Under the respective conditions, the measurement was performed five times and its average value is determined.

(2) Measurement of Wafer Surface Contamination by using ESCA

A 8 inch silicon mirror wafer was cut into pieces having a square shape of 1 cm in side by using a diamond cutter without contaminating the surface. The surface of the cut wafer was measured under the following conditions by using ESCA to determine a ratio of carbon to silicon (hereinafter referred to as a ratio C/Si), and then the contamination state of the silicon wafer is examined.

<ESCA Measurement Conditions and Method for Calculation of Ratio C/Si>

X-ray source: MgK α ray (1253.6 eV), X-ray output: 300 W, Measuring vacuum degree: not more than $2 \times 10^{-7}$ Pa, C/Si: (peak area of carbon)/(peak area of silicon)

<Method for Evaluation of Ratio C/Si>

The C/Si value of the silicon mirror wafer before applying a test sample is 0.10 (blank value). Accordingly, it is judged that no contamination is recognized when the C/Si value of the silicon mirror wafer after applying the test sample is from about 0.10 to 0.12, whereas, it is judged that contamination is recognized when the C/Si value exceeds the above range.

(3) Measurement of Adhesive Force

A test sample is applied on the surface of a SUS-BA plate having a size of 5×20 cm at 23° C. via an adhesive layer, and then allowed to stand for 1 hour. The stress, produced by peeling off the test sample from the SUS-BA plate at a peel angle of 180 degree and a peel rate of 300 mm/min. with holding one end of the test sample, is measured and then reduced in terms of g/25 mm.

Example 1

148 Parts by weight of deionized water, 2 parts by weight (1 part by weight as a surfactant alone) of an ammonium salt of polyoxyethylene nonyl phenyl ether sulfate (trade name: Newcol-560SF manufactured by Nippon Nyukazai Co., Ltd., aqueous 50 wt % solution) as an anionic surfactant, 0.5 parts by weight of 4,4'-azobis-4-cyanovaleric acid (trade name: ACVA, manufactured by Otsuka Chemistry Co., Ltd.) as a polymerization initiator, 74 parts by weight of butyl acrylate, 14 parts by weight of methyl methacrylate, 9 parts by weight of 2-hydroxyethyl methacrylate, 2 parts by weight of methacrylic acid and 1 part by weight of acrylamide are charged in a polymerization reactor and the emulsion polymerization was carried out at 70° C. with stirring for 9 hours to obtain an aqueous acrylic resin emulsion. This emulsion was neutralized with 14 wt % ammonia water to obtain an adhesive polymer (chief material) emulsion. 100 Parts by weight of the resulting adhesive chief material emulsion (concentration of adhesive polymer: about 40% by weight) was collected and the pH was further adjusted to 9.3 by adding 14 wt % ammonia water. Then, 2 parts by weight of an aziridine crosslinking agent (trade name: Chemitite PZ-33, manufactured by Nippon Shokubai Co., Ltd.) and 5 parts by weight of diethylene glycol monobutyl ether as a film-forming auxiliary were added to obtain an adhesive coating solution.

Using a polypropylene film having a thickness of 50 μm, a Vicat softening point of 140° C. and a surface tension (of one surface) of 30 dyne/cm, formed by the T-die extrusion method, as a release film, an aqueous acrylic resin emulsion type adhesive obtained by the above method was applied on one surface of the release film by the roll coater method, and then dried at 100° C. for 60 seconds, thereby providing an acrylic adhesive layer having a thickness of 10 μm on the surface of the release film.

An unstretched ethylene-vinyl acetate copolymer (hereinafter referred to as EVA) film formed by the T-die extrusion method was stretched at 50° C. in a stretch ratio of 3.0 in the longitudinal direction, and then thermally fixed at 60° C. to form a monoaxially stretched EVA film having a thickness of 120 μm. One surface of the monoaxially stretched EVA film was subjected to a corona discharge treatment, thereby adjusting the surface tension to 50 dyne/cm, and the resulting film was used as a base film.

An adhesive tape having an adhesive force of 200 g/25 mm was obtained by placing the corona discharge-treated surface of the base film to the surface of the acrylic adhesive layer provided on the release film and pressing at a pressure of 2 kg/cm$^2$, thereby transferring the adhesive layer to the base film. The heat shrinkage factor at each temperature of the adhesive tape was measured by the above procedure. The results are shown in Table 1.

The resulting adhesive tape was applied on the surface of the fifty mirror wafers having a diameter of 8 inch and a thickness of 700 μm and the wafers were supplied to a back surface grinding machine. In the grinding machine, rough grinding, finish grinding and back surface washing were carried out in order. That is, in the back surface grinding machine, the mirror wafer was roughly ground at a grinding rate of 300 μm/min., thereby reducing the thickness to 170 μm, and then finish grinding was carried out at a rate of 20 μm/min, thereby to reduce the thickness to 120 μm. Finally, the back surface was washed and, after turning over the wafer, warm water at 60° C. was poured on the adhesive tape applied on the wafer surface for 10 seconds. Then, warm water at 60° C. was further poured for 10 seconds with rotating the wafer at 500 rpm, thereby peeling off the adhesive tape. After rotating at 3000 rpm and drying, the wafer was taken out from the grinding machine and then encased in the cassette. All fifty wafers could be encased without causing the breakage. The time required from the beginning of the grinding to encasing was 150 minutes. The results are shown in Table 1.

Example 2

In the same manner as that described in Example 1, except that the adhesive tape was heated by a warm air at 80° C. for 30 seconds after grinding the back surface of wafer, a semiconductor wafer was ground and the tape was peeled off. All fifty wafers could be encased without causing breakage. The time required from the beginning of the grinding to encasing was 160 minutes. The results are shown in Table 1.

Example 3

In the same manner as that described in Example 1, the semiconductor wafer was ground and the adhesive tape was peeled off. Furthermore, the wafer was washed with pure water with rotating at a rotational speed of 1000 rpm for 3 minutes, dried at 3000 rpm and then taken out. All fifty wafers could be encased without causing breakage. The time required from the beginning of the grinding to encasing was 160 minutes. The surface contamination of the encased 8 inch mirror wafer was measured by the above procedure. The results are shown in Table 1.

Example 4

In the same manner as that described in Example 3, except that a mirror wafer having a bore diameter of 6 inch and a thickness of 600 μm was used and the thickness after rough grinding was adjusted to 150 μm and the thickness after finish grinding was adjusted to 80 μm, the semiconductor wafer was ground and then peeling of the adhesive tape and washing of the wafer were performed. As a result, all fifty wafers could be encased without causing breakage. The time required from the beginning of the grinding to encasing was 160 minutes. The results are shown in Table 1.

Comparative Example 1

In the same manner as that described in Example 1, except that one surface of the unstretched EVA film having a thickness of 120 μm was subjected to a corona discharge treatment, thereby adjusting the surface tension to 50 dyne/cm, and this film was used as a base film, an adhesive tape was obtained. The resulting adhesive tape was applied on the surface of fifty mirror wafers having a diameter of 8 inch and a thickness of 700 μm and then fed to a back surface grinding machine. In the back surface grinding machine, rough grinding and finish grinding were carried out in the same manner as that described in Example 1. Then, the back surface was washed and dried and the resulting wafer was encased in the cassette.

Then, the cassette was fed to an adhesive tape peeling device, where the tape was peeled off. Two wafers were broken by contacting with a encasing port of the cassette when the wafers are taken out from the back surface grinding machine and then encased in the cassette. Furthermore, one wafer was broken when the wafer was fixed to the chuck table before peeling off the tape in the adhesive tape peeling device, and four wafers were broken in case of tape peeling. The time required from the beginning of the grinding to encasing after peeling of the tape was 190 minutes. The results are shown in Table 1.

Comparative Example 2

In the same manner as that described in Comparative Example 1, the semiconductor wafer was ground and the tape was peeled off. Furthermore, the wafer was fed to the washing step and preliminary washing and proper washing were performed for 3 minutes and 5 minutes, respectively, in a cassette type overflow washing tank. Then, the wafer was dried by using a rotary drier. Two wafers were broken by contacting with a encasing port of the cassette when the wafers are taken out from the back surface grinding machine and then encased in the cassette. Furthermore, one wafer was broken when the wafer was fixed to the chuck table before peeling off the tape in the device for peeling an adhesive tape for semiconductor surface protection, and two wafers were broken in case of tape peeling. The time required from the beginning of the grinding to encasing after tape peeling was 190 minutes. Furthermore, one wafer was broken in case of transferring to the washing step. The time required from the beginning of the grinding to the completion of washing was 220 minutes. The surface contamination of the encased 8 inch mirror wafer was measured. The results are shown in Table 1.

TABLE 1

|  |  | Example | | | | Comp. Example | |
| --- | --- | --- | --- | --- | --- | --- | --- |
|  |  | 1 | 2 | 3 | 4 | 1 | 2 |
| Base film | Composition | EVA | EVA | EVA | EVA | EVA | EVA |
|  | Stretching ratio | 3 | 3 | 3 | 3 | unstretched | unstretched |
|  | Stretching direction | monoaxial (longitudinal) | monoaxial (longitudinal) | monoaxial (longitudinal) | monoaxial (longitudinal) | unstretched | Unstretched |
| Adhesive tape | Shrinkage factor (%) 25° C. | 0 | 0 | 0 | 0 | 0 | 0 |
|  | 50° C. | 10 | 10 | 10 | 10 | 0 | 0 |
|  | 80° C. | 40 | 40 | 40 | 40 | 0 | 0 |
|  | Adhesive force (g/25 mm) | 200 | 200 | 200 | 200 | 200 | 200 |
| Heating method |  | Warm water | Warm air | Warm water | Warm water | — | — |
| Temperature (° C.) |  | 60 | 90 | 60 | 60 | — | — |
| Heating time (second) |  | 20 | 30 | 20 | 20 | — | — |
| Working time (minute) | Time required to tape peeling | 150 | 160 | 150 | 150 | 190 | 190 |
|  | Time required to wafer washing | — | — | 160 | 160 | — | 220 |
| Breakage of wafer (number of wafers broken) | Back surface grinding | 0 | 0 | 0 | 0 | 2 | 2 |
|  | Tape peeling | 0 | 0 | 0 | 0 | 5 | 3 |
|  | Wafer washing | — | — | 0 | 0 | — | 1 |
| EACA analysis | C/Si | — | — | 0.1 | 0.1 | — | 0.1 |
|  | Contamination of wafer | — | — | none | none | — | None |

What is claimed is:

1. A method of producing a semiconductor wafer using a protective adhesive tape having heat shrinkability, comprising:
   (a) applying the adhesive tape to a surface of the semiconductor wafer on which an integrated circuit is mounted;
   (b) grinding a back surface of the semiconductor wafer using a grinding machine, and
   (c) successively heating and peeling off the adhesive tape from the surface of the semiconductor wafer in the grinding machine.

2. The method of producing a semiconductor wafer according to claim 1, wherein the back surface of the semiconductor wafer having a diameter of 6 to 16 inch is ground, thereby reducing the thickness to 80 to 400 μm.

3. The method of producing a semiconductor wafer according to claim 2, wherein the back surface of the semiconductor wafer having a diameter of 6 to 16 inch is ground, thereby reducing the thickness to 80 to 200 μm.

4. The method of producing a semiconductor wafer according to claim 3, wherein the back surface of the semiconductor wafer having a diameter of 6 to 12 inch is ground, thereby reducing the thickness to 80 to 200 μm.

5. The method of producing a semiconductor wafer according to claim 1, wherein the adhesive tape is heated to a temperature ranging from 50 to 99° C. using at least one heating medium selected from the group consisting of warm water and warm air.

6. The method of producing a semiconductor wafer according to claim 5, wherein the temperature of the heating medium is from 50 to 80° C.

7. The method of producing a semiconductor wafer according to claim 5, wherein the adhesive tape is heated to a temperature ranging from 50 to 99° C. using warm water.

8. The method of producing a semiconductor wafer according to claim 7, wherein the adhesive tape is heated to a temperature ranging from 50 to 80° C. using warm water.

9. The method of producing a semiconductor wafer according to claim 1, wherein the semiconductor wafer is heated with rotating at a rotational speed of 5 to 500 rpm.

10. The method of producing a semiconductor wafer according to claim 1, wherein a heat shrinkage factor of the adhesive tape is from 5 to 50% at 50 to 99° C.

11. The method of producing a semiconductor wafer according to claim 10, wherein a heat shrinkage factor of the adhesive tape is from 5 to 50% at 50 to 80° C.

12. The method of producing a semiconductor wafer according to claim 1, wherein the adhesive tape is peeled off from the surface of the semiconductor wafer and, furthermore, the surface of the semiconductor wafer is washed with a washing liquid.

\* \* \* \* \*

UNITED STATES PATENT AND TRADEMARK OFFICE
CERTIFICATE OF CORRECTION

PATENT NO.    : 6,273,791 B1
DATED         : August 14, 2001
INVENTOR(S)   : Makoto Kataoka et al.

It is certified that error appears in the above-identified patent and that said Letters Patent is hereby corrected as shown below:

Title page,
Item [56], FOREIGN PATENT DOCUMENTS, please add:
-- JP8-302293   11/98   (JP)
   JP8-222535   8/96    (JP) --

Signed and Sealed this

Second Day of July, 2002

*Attest:*

*Attesting Officer*

JAMES E. ROGAN
*Director of the United States Patent and Trademark Office*